US010290719B1

(12) United States Patent
Li et al.

(10) Patent No.: US 10,290,719 B1
(45) Date of Patent: May 14, 2019

(54) INDIUM GALLIUM ARSENIDE METAL OXIDE SEMICONDUCTOR FIELD EFFECT TRANSISTOR HAVING A LOW CONTACT RESISTANCE TO METAL ELECTRODE

(71) Applicant: INTERNATIONAL BUSINESS MACHINES CORPORATION, Armonk, NY (US)

(72) Inventors: Ning Li, White Plains, NY (US); Yun Seog Lee, Seoul (KR); Joel P. de Souza, Putam Valley, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/855,273

(22) Filed: Dec. 27, 2017

(51) Int. Cl.
*H01L 21/00* (2006.01)
*H01L 21/16* (2006.01)
*H01L 33/00* (2010.01)
*H01L 29/45* (2006.01)
*H01L 29/66* (2006.01)
*H01L 21/02* (2006.01)
*H01L 21/768* (2006.01)

(52) U.S. Cl.
CPC ........ *H01L 29/452* (2013.01); *H01L 21/0228* (2013.01); *H01L 21/02178* (2013.01); *H01L 21/02205* (2013.01); *H01L 21/02554* (2013.01); *H01L 21/02576* (2013.01); *H01L 21/76895* (2013.01); *H01L 29/66522* (2013.01)

(58) Field of Classification Search
CPC ......... H01L 21/02178; H01L 21/02205; H01L 21/0228; H01L 29/456
USPC ............................................ 438/104; 257/96
See application file for complete search history.

(56) References Cited

U.S. PATENT DOCUMENTS

| 5,352,342 | A | 10/1994 | Riffe |
| 5,889,295 | A | 3/1999 | Rennie et al. |
| 9,076,641 | B2 | 7/2015 | Ahmed |
| 9,536,945 | B1 * | 1/2017 | de Souza .......... H01L 29/78603 |
| 9,583,562 | B2 | 2/2017 | de Souza et al. |
| 9,608,185 | B2 | 3/2017 | Hu et al. |
| 9,984,949 | B1 * | 5/2018 | de Souza ............ H01L 23/3171 |
| 2008/0258133 | A1 | 10/2008 | Seong |
| 2016/0322515 | A1 * | 11/2016 | Li ....................... H01L 31/1868 |

(Continued)

OTHER PUBLICATIONS

Manik, P.P. et al., "Fermi-level unpinning and low resistivity in contacts to n-type Ge with a thin ZnO interfacial layer" Applied Physics Letters (Nov. 2012) pp. 182105-1-182105-5, vol. 101.

*Primary Examiner* — David S Blum
(74) *Attorney, Agent, or Firm* — Tutunjian & Bitetto, P.C.; Daniel P. Morris (57) ABSTRACT

A semiconductor device that includes source and drain regions that are doped to an n-type conductivity and are comprised of a type III-V semiconductor material. The semiconductor device further includes a contact to at least one of the source and drain regions. The contact includes an interface passivation layer atop the at least one source and drain region, and an n-type zinc oxide layer. A conduction band of the type III-V semiconductor material of the at least one source and drain region is substantially aligned with a conduction band of the n-type zinc oxide containing layer.

20 Claims, 6 Drawing Sheets

(56) References Cited

U.S. PATENT DOCUMENTS

2018/0240674 A1\* 8/2018 Bilodeau ........... H01L 21/02532
2018/0248015 A1\* 8/2018 Glass ...................... H01L 29/78

\* cited by examiner

INDIUM GALLIUM ARSENIDE METAL OXIDE SEMICONDUCTOR FIELD EFFECT TRANSISTOR HAVING A LOW CONTACT RESISTANCE TO METAL ELECTRODE

BACKGROUND

Technical Field

The present disclosure relates to semiconductor devices, and more particularly to metal oxide semiconductor field effect transistors including type III-V semiconductors.

Description of the Related Art

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical. Changes to the transistor architecture have included: straining the channel, by inserting germanium into source and drain regions; switching the gate dielectric from silicon dioxide to hafnium dioxide to prevent leakage currents from escalating; and introducing a three-dimensional finFET to help the gate maintain control over charge carriers in the channel. Further refinements are sure to follow, and may well include the introduction of new channel materials that sport a higher mobility. For the pFET, germanium is the most likely successor for the channel, while for the nFET it is some form of III-V semiconductor material.

SUMMARY

In one aspect, the present disclosure provides a method of forming a low contact resistance to metal electrode that is suitable for metal oxide semiconductor field effect transistors (MOSFETs) that include a channel region composed of a type III-V semiconductor material, such as indium gallium arsenide (InGaAs).

In one embodiment, the method includes providing a field effect transistor including at least one of a source region and a drain region composed of a type III-V semiconductor material and an n-type conductivity. At least one of sulfur passivation layer and an aluminum containing layer is formed on an interface surface of the at least one source region and said drain region of the type III-V semiconductor material to provide a passivated surface of said at least one of the source region and the drain region. An n-type zinc oxide containing layer is formed on the passivated surface of said at least one of the source region and the drain region. A metal contact is formed on the n-type zinc oxide containing layer.

In another embodiment, the method includes providing a field effect transistor including at least one of a source region and a drain region composed of indium gallium arsenide (InGaAs) doped to an n-type conductivity. At least one of sulfur passivation layer and an aluminum containing layer is formed on an interface surface of the at least one source region and said drain region of the type III-V semiconductor material to provide a passivated surface of said at least one of the source region and the drain region. An n-type zinc oxide containing layer is formed on the passivated surface of the source region and the drain region, wherein a conduction band of the InGaAs in said at least one of the source and drain region is substantially aligned with a conduction band of the n-type zinc oxide containing layer. A metal contact is formed on the n-type zinc oxide containing layer.

In another aspect of the present disclosure, a semiconductor device is provided that includes source and drain regions that are doped to an n-type conductivity and are composed of a type III-V semiconductor material. A contact is present to at least one of the source and drain regions, wherein the contact comprises an interface passivation layer atop the at least one source and drain region, and an n-type zinc oxide layer, wherein a conduction band of the type III-V semiconductor material of the at least one source and drain region is substantially aligned with a conduction band of the n-type zinc oxide containing layer. The contact may further include a metal containing portion on the n-type zinc oxide containing layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure provides structures and methods for forming metal semiconductor field effect transistors (MOSFETs) that include type III-V semiconductor materials. As used herein, a "field effect transistor" is a transistor in which output current, i.e., source-drain current, is controlled by the voltage applied to the gate structure. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. In contrast to type III-V semiconductor materials, by "type IV semiconductor" it is meant that the semiconductor material includes at least one element from Group IVA (i.e., Group 14) of the Periodic Table of Elements.

MOSFET devices composed of III-V semiconductor materials, such as indium gallium arsenide-based MOSFET devices, are suitable for high performance microelectronics. Indium gallium arsenide (InGaAs) (alternatively gallium indium arsenide) is a ternary alloy (chemical compound) of indium, gallium and arsenic. It has been determined that there is a need to minimize contact resistance between metal contact and n-type InGaAs, in MOSFET devices including source and drain regions, composed of n-type InGaAs, as well as other type III-V semiconductor materials, in particular for microelectronics applications with aggressive scaling-down.

Further, a doping limit has been acknowledged in type III-V semiconductor materials, such as indium gallium arsenide (InGaAs). It has been determined that a heavily doped n-type material with an electron density higher than that of indium gallium arsenide (InGaAs) is also desired to reduced metal-contact resistance in the formation of contacts to source and drain regions composed of III-V semiconductor materials, such as indium gallium arsenide (InGaAs). Additionally, Fermi-level pinning at contact interfaces with type III-V semiconductor materials, e.g., an indium gallium arsenide interface, may be substantially reduced by interface passivation.

In some embodiments, the methods and structures described herein overcome the aforementioned difficulties by a method of forming a contact to a III-V semiconductor material of a MOSFET, such as a n-type doped source/drain region, that includes an interface passivation on the type III-V semiconductor material, such as indium gallium arsenide (InGaAs), with a sulfur passivation layer and/or aluminum oxide ($Al_2O_3$) monolayer. The method of forming the contact may further include forming a zinc oxide n-type layer that can provide for proper band alignment between the zinc oxide type layer and the III-V semiconductor material of the source/drain region of the device, e.g., n-type indium gallium arsenide (InGaAs) source/drain region. Therefore, a metal fill for the contact may be formed. The methods and structures of the present disclosure are now described with greater detail with reference to FIGS. 1-6.

Figure 1:
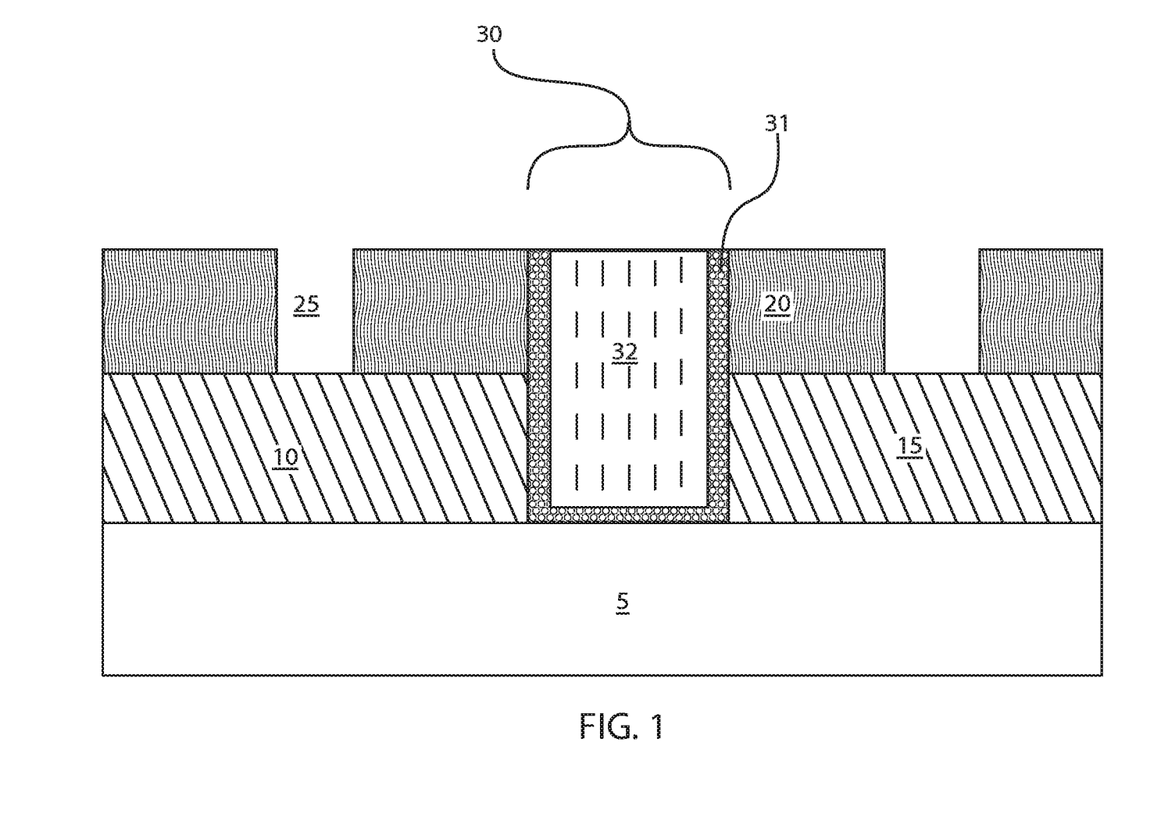
FIG. 1 is a side cross-sectional view of a metal oxide semiconductor field effect transistor device that includes at least one of a source region and a drain region that can be composed of a type III-V semiconductor material having an n-type conductivity, in accordance with one embodiment of the present disclosure.

FIG. 1 depicts one embodiment of a metal oxide semiconductor field effect transistor (MOSFET) device that includes a channel region 5 that can be composed of a type III-V semiconductor material. In one embodiment, the channel region 5 is composed of indium gallium arsenide (InGaAs). It is noted that indium gallium arsenide (InGaAs) is only one example of a III-V semiconductor material that is suitable for the channel region 5 of the device depicted in FIG. 1. The present disclosure is not limited to only this example. For example, the channel region 5 may also be composed of a III-V semiconductor material that is selected from the group consisting of indium aluminum arsenic (InAlAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof. The channel region 5 is typically composed of a single crystalline material.

Although not depicted in FIG. 1, a supporting structure may be present underlying the channel region 5. In the example, in which the channel region 5 is composed of indium gallium arsenide (InGaAs), the channel region 5 may be present on an indium aluminum arsenic (InAlAs) barrier layer, and the indium aluminum arsenic (InAlAs) barrier layer is present on a substrate composed of indium phosphide (InP). In some examples, the indium phosphide (InP) may be present overlying a type IV supporting substrate, such as a silicon (Si) supporting substrate. Examples of other type IV semiconductor materials for the type IV supporting substrate may include germanium (Ge) and silicon germanium (Ge).

The channel region 5 may be formed on the aforementioned material stack using an epitaxial deposition process. In other embodiments, the channel region 5 may be formed on a handle substrate and then transferred to the structure depicted in FIG. 1 using layer transfer and bonding methods.

FIG. 1 further depicts a gate structure 30 formed on the channel region 5. The gate structure 30 may include a gate dielectric 31 and a gate conductor 32. The gate dielectric 31 may be composed of a high-k gate dielectric. The term "high-k", as used herein, denotes a dielectric constant that is greater than the dielectric constant of silicon oxide, which is typically equal to 4 (i.e., typically a silicon oxide) measured in vacuum at room temperature (20° C. to 25° C.). Some examples of high-k dielectric materials suitable for the high-k gate dielectric layer 31 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed for the high-k gate dielectric layer 31 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof. In one embodiment, the high-k gate dielectric layer 31 has a thickness that ranges from 1 nm to 10 nm. In another embodiment, the high-k gate dielectric layer 31 has a thickness that ranges from 1 nm to 4 nm. The thickness of the high-k gate dielectric layer 31 may be conformal, and the cross-sectional geometry of the high-k gate dielectric layer 31 may be U-shaped, as depicted in FIG. 1.

The gate conductor 32 is present on the gate dielectric 31. The gate conductor 32 may comprise polysilicon, SiGe, a silicide, a metal or a metal-silicon-nitride such as Ta—Si—N. Examples of metals that can be used as the gate electrode 82 include, but are not limited to, Al, W, Cu, and Ti or other like conductive metals. The layer of conductive material for the gate conductor 32 may be doped or undoped. For example, the gate conductor 32 may be composed of doped polysilicon. If doped, an in-situ doping deposition process may be employed. Alternatively, a doped conductive material can be formed by deposition, ion implantation and annealing.

The gate structure 30 may be formed using gate first methods, i.e., before the formation of the source region 10 and the drain region 15. In other embodiments, the gate structure 30 can be formed using gate last methods. For example, a sacrificial gate structure (also referred to as dummy gate) may be formed as a placeholder prior to forming the source and drain regions 10, 15. After forming the source and drain regions 10, 15, the sacrificial gate structure may be replaced with a functional gate structure including a gate dielectric 31 and a gate conductor 32, similar to the gate structure 30 depicted in FIG. 1.

FIG. 1 depicts one embodiment of a metal oxide semiconductor field effect transistor (MOSFET) device that includes a source region 10 and a drain region 15 that can be composed of a type III-V semiconductor material having an n-type conductivity. The source and drain regions 10, 15 may be present atop the III-V semiconductor layer that provides the channel region 5, in which the source and drain regions 10, 15 are on opposing sides of the gate structure 30. Similar to the channel region 5, the source region 10 and the drain region 15 may be composed of indium gallium arsenide (InGaAs). The source and drain regions 10, 15 may be doped to an n-type conductivity. As used herein, "n-type" refers to the addition of impurities that contributes free electrons to an intrinsic semiconductor. For providing an n-type dopant in a type III-V semiconductor layer, such as indium gallium arsenide (InGaAs), a dopant may be selected from Group IV or VI of the Periodic Table of Elements. The concentration of the n-type dopant that provides the source and drain regions 10, 15 may range from about $10^{18}$ atoms/$cm^3$ to about $10^{20}$ atoms/$cm^3$. In one example, the concentration of the n-type dopant that provides the source and drain regions 10, 15 may be equal to about $1 \times 10^{19}$ atoms/$cm^3$.

The source and drain regions 10, 15 may be formed using epitaxial deposition on the exposed surfaces of the layer that provides the channel region 5 on opposing sides of the gate structure 30. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus. The dopant that provides the n-type conductivity of the source and drain regions 10, 15 may be introduced to the source and drain regions 10, 15 by in situ doping. The term "in situ" denotes that the dopant that dictates the conductivity type of a material is introduced while the material is being formed, e.g., during the epitaxial growth process.

Still referring to FIG. 1, an interlevel dielectric layer 20 is present atop the source and drain regions 10, 15, and has an upper surface that is substantially coplanar with the upper surface of the gate structure 30. The interlevel dielectric layer may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer 20 maybe deposited using a method such as spin on deposition and/or chemical vapor deposition (CVD) that is followed by planarization, e.g., chemical mechanical planarization (CMP).

Contact openings 25 may be formed through the interlevel dielectric layer 20 using photolithography and etch processes. An etch mask may be formed on the interlevel dielectric layer 20 exposing the portions of the interlevel dielectric layer 20 to provide the contact openings 25. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections of the interlevel dielectric layer 20 covered by the photoresist are protected while the exposed regions of the interlevel dielectric layer 20 are removed using a selective etching process that removes the unprotected regions to provide the contact openings 25. The contact openings 25 expose the interface portions of the n-type III-V semiconductor material, e.g., n-type indium gallium arsenide (InGaAs), of the source and drain regions 10, 15.

Figure 2:
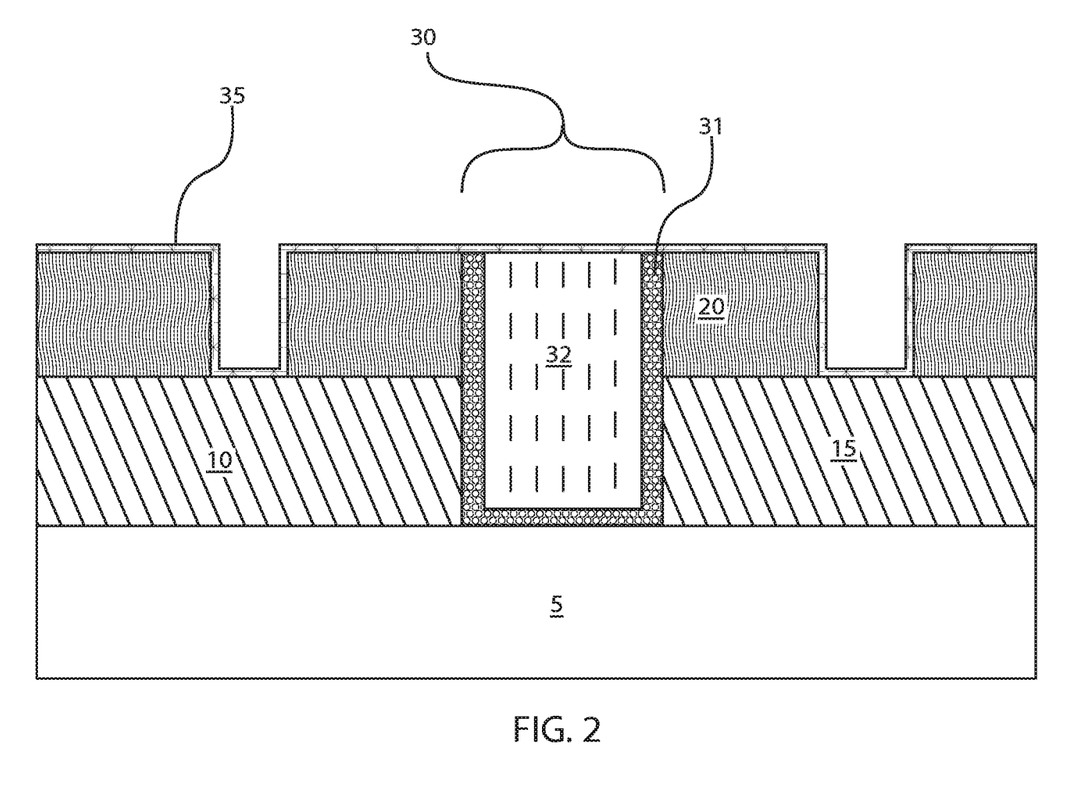
FIG. 2 is a side cross-sectional view of forming a surface passivation layer on an interface surface of at least one of the source region and the drain region, and forming an n-type zinc oxide layer on the surface passivation layer, in accordance with one embodiment of the present disclosure.

FIG. 2 depicts forming a surface passivation layer on an interface surface of at least one of the source region and the drain region 10, 15, and forming an n-type zinc oxide layer 35 on the surface passivation layer.

The surface passivation of the interface surface of the source and drain regions 10, 15 may include the formation of a sulfur passivation layer. The sulfur passivation layer is formed on the exposed interface surface of the III-V semiconductor material, e.g., indium gallium arsenide (InGaAs) that is doped to an n-type conductivity. The sulfur passivation layer may be formed by treating the interface surface of the source and drain regions 10, 15 with a thiourea containing solution. Thiourea is an organosulfur compound with the formula $SC(NH_2)_2$. Thiourea is structurally similar to urea, except that the oxygen atom is replaced by a sulfur atom. In some embodiments, the thiourea containing solution is applied by spraying, brushing, curtain coating, and submersion application. In some examples, the thiourea containing solution may be applied to the interface surface of the source and drain regions 10, 15 at room temperature, e.g., 20° C. to 25° C. In other examples, the thiourea containing solution may be applied at elevated temperatures, e.g., ranging from 60° C. to 95° C. In some embodiments, the thiourea containing solution may include a mixture with ammonium hydroxide. In one example, the thiourea-ammonium hydroxide treatment includes a 12.1 M ammonia and 0.033 M thiourea solution. The ammonium hydroxide in the treatment solution quickly removes native oxides from the interface surface of the III-V semiconductor material, e.g., indium gallium arsenide, of the source and drain regions 10, 15. Further, the thiourea of the solution forms a protective sulfide film, which may be composed of at least indium (In) and sulfur (S), on the interface surface of the III-V semiconductor material, e.g., indium gallium arsenide. The thickness of the protective sulfide film, i.e., passivation layer, may be on the order of a single monolayer, e.g., less than 5 nm. In one example, the thickness of the passivation layer provided by sulfur passivation layer is 1 nm or less.

Still referring to FIG. 2, passivation of the interface surface of the source and drain regions 10, 15 may include the formation of an aluminum containing dielectric, such as aluminum oxide ($Al_2O_3$). The aluminum containing dielectric may be formed using atomic layer deposition. Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In one example, the precursors for the ALD deposition of a passivation layer of aluminum oxide ($Al_2O_3$) include trimethylaluminum ($Al_2(CH_3)_6$)(abbreviated TMA) and water. The passivation layer of aluminum oxide ($Al_2O_3$) may be one monolayer thick. In some embodiment, the thickness of the passivation layer of aluminum oxide ($Al_2O_3$) can range from 1 angstrom to 5 nanometers. In some embodiments, the monolayer deposition provided by the atomic layer depositions mechanisms provides that the layer be conformal. The term "conformal" denotes a layer having a thickness that does not deviate from greater than or less than 30% of an average value for the thickness of the layer.

It is noted that the surface passivation layer may include either of the above described surface passivation layer and the atomic layer deposition (ALD) deposited aluminum containing dielectric, e.g., aluminum oxide ($Al_2O_3$), may provide the surface passivation layer as alternatives to one another. In other embodiments, the surface passivation layer may include a stacked structure of the sulfur passivation layer directly on the interface surface of the source and drain regions 10, 15 followed by the ALD deposited aluminum containing dielectric being formed on the sulfur passivation layer.

Still referring to FIG. 2, following passivation of the interface surface of the source and drain regions 10, 15, an n-type zinc oxide containing layer 35 is formed. In some embodiments, the n-type zinc oxide containing layer 35 is formed directly on the passivated surface of the source region and the drain region 10, 15, wherein a conduction band of the n-type InGaAs of at least one of the source and drain region 10, 15 is substantially aligned with a conduction band of the n-type zinc oxide containing layer 35. In some embodiments, the n-type zinc oxide containing layer 35 is a material having a high doping limit. For example, the n-type zinc oxide containing layer 35 can have an electron density that is equal to or greater than $10^{21}$ $cm^3$. Typical n-type dopants for the n-type zinc oxide containing layer may include aluminum (Al), boron (B), gallium (Ga), and combinations thereof.

The n-type zinc oxide containing layer 35 may be blanket deposited atop the passivated surface of the source and drain regions 10, 15, as well as the sidewalls of the contact opening 25 provided by the interlevel dielectric layer 20, as well as the upper surface of the interlevel dielectric layer 20.

The n-type zinc oxide containing layer 35 may be formed using various deposition methods, such as atomic layer deposition (ALD), chemical vapor deposition (CVD) and/or sputtering. In some embodiments, the deposition method for forming the n-type zinc oxide containing layer 35 may be a low temperature process, which may include deposition at temperatures of 400° C. or less.

The n-type zinc oxide containing layer 35 may be formed using atomic layer deposition (ALD). The ALD precursor for ZnO may include diethyl zinc and water. Diethylzinc $(C_2H_5)_2Zn$ is a highly pyrophoric organozinc compound consisting of a zinc center bound to two ethyl groups. When the n-type zinc oxide containing layer 35 is doped during the atomic layer deposition (ALD) process, and the n-type dopant is aluminum (Al), the dopant precursor may include trimethylaluminum ($Al_2(CH_3)_6$)(abbreviated TMA) and water are also used.

The n-type zinc oxide containing layer 35 may also be formed using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. Gas precursors for the CVD method of forming the n-type zinc oxide layer as similar to the gas precursors described above for the ALD method. Further, the n-type dopant may be introduced to the zinc oxide layer using in situ doping via chemical vapor deposition.

In yet another embodiment, the n-type zinc oxide layer 35 may be formed using a physical vapor deposition (PVD) method such as sputtering. As used herein, "sputtering" means a method of depositing a film of material on a semiconductor surface. A target of the desired material, i.e., source, is bombarded with particles, e.g., ions, which knock atoms from the target, and the dislodged target material deposits on the deposition surface. Examples of sputtering techniques suitable for depositing the metallic adhesion layer 16, but are not limited too, DC diode sputtering ("also referred to as DC sputtering"), radio frequency (RF) sputtering, magnetron sputtering, and ionized metal plasma (IMP) sputtering. In some embodiments, both the zinc oxide composition and the dopant composition that provides the n-type dopant may be present in the target from which the sputtered layer is deposited.

The aforementioned method sequence provides one embodiment of a method for forming a zinc oxide (ZnO)-indium gallium arsenide (InGaAs) contact. More specifically, the aforementioned method sequence can provide for band-alignment between n$^+$-ZnO layer 35 and the n-type InGaAs of the source and drain region 10, 15. In some embodiment, the contact functions at its optimum electrical performance when the conduction band of the InGaAs material of the n-type source and drain regions 10, 15 is aligned with the conduction band of n-ZnO layer 35.

Figure 3:
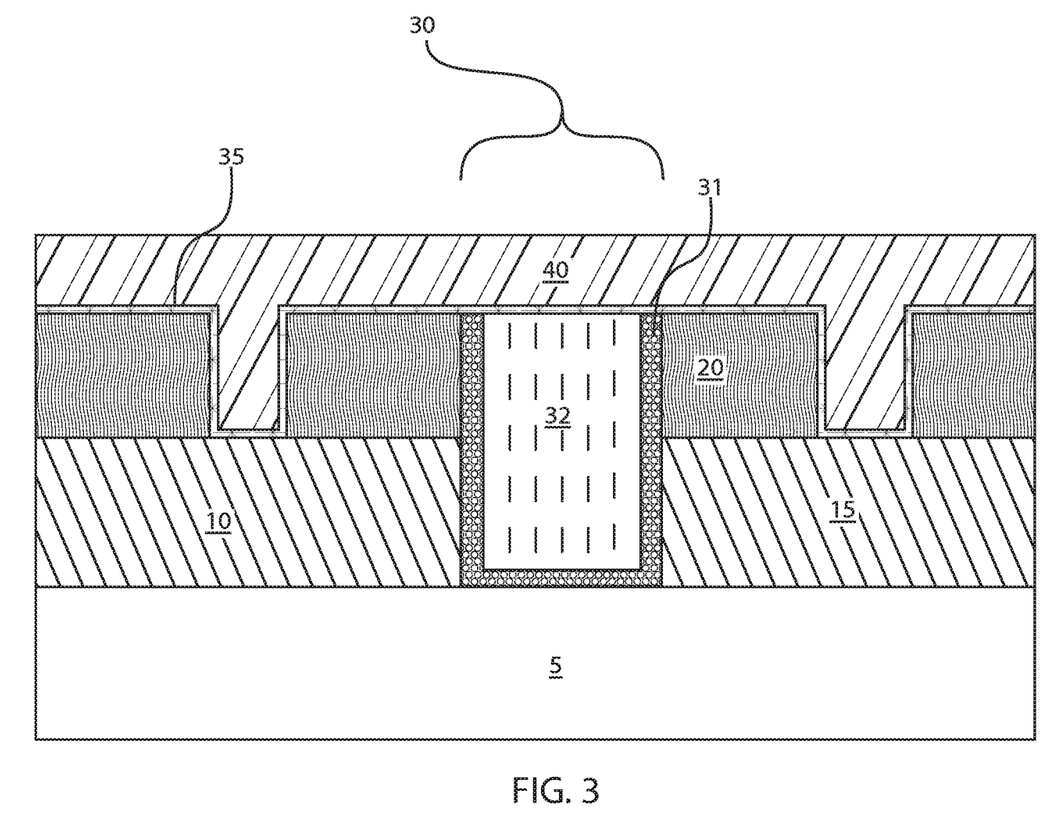
FIG. 3 is a side cross-sectional view of forming a metal fill and corresponding metal layer on the n-type zinc oxide layer that is depicted in FIG. 2, in accordance with one embodiment of the present disclosure.

FIG. 3 depicts one embodiment of forming a metal fill 40 and corresponding metal layer 40 on the n-type zinc oxide layer 35 that is depicted in FIG. 2. In some embodiments, the metal for the metal fill 40 is composed of titanium (Ti) and/or aluminum (Al). It is noted that these materials are provided for illustrative purposes and are not intended to limit the present disclosure. For example, the metal fill 40 may also be composed of copper (Cu), silver (Ag), gold (Au), platinum (Pt), tungsten (W), tantalum (Ta), titanium (Ti), as well as alloys and nitrides of the aforementioned materials.

The metal fill 40 is deposited to a thickness to fill and entirety of the contact openings 25. The metal fill 40 may be deposited to a thickness that overfull the contact openings 25 as depicted in FIG. 3. In some examples, the metal fill 40 is deposited by chemical vapor deposition (CVD), such as plasma enhanced chemical vapor deposition (PECVD) and/or metal organic chemical vapor deposition; physical vapor deposition processes, such as sputtering; and plating processes, such as electroplating and/or electroless plating.

Figure 4:
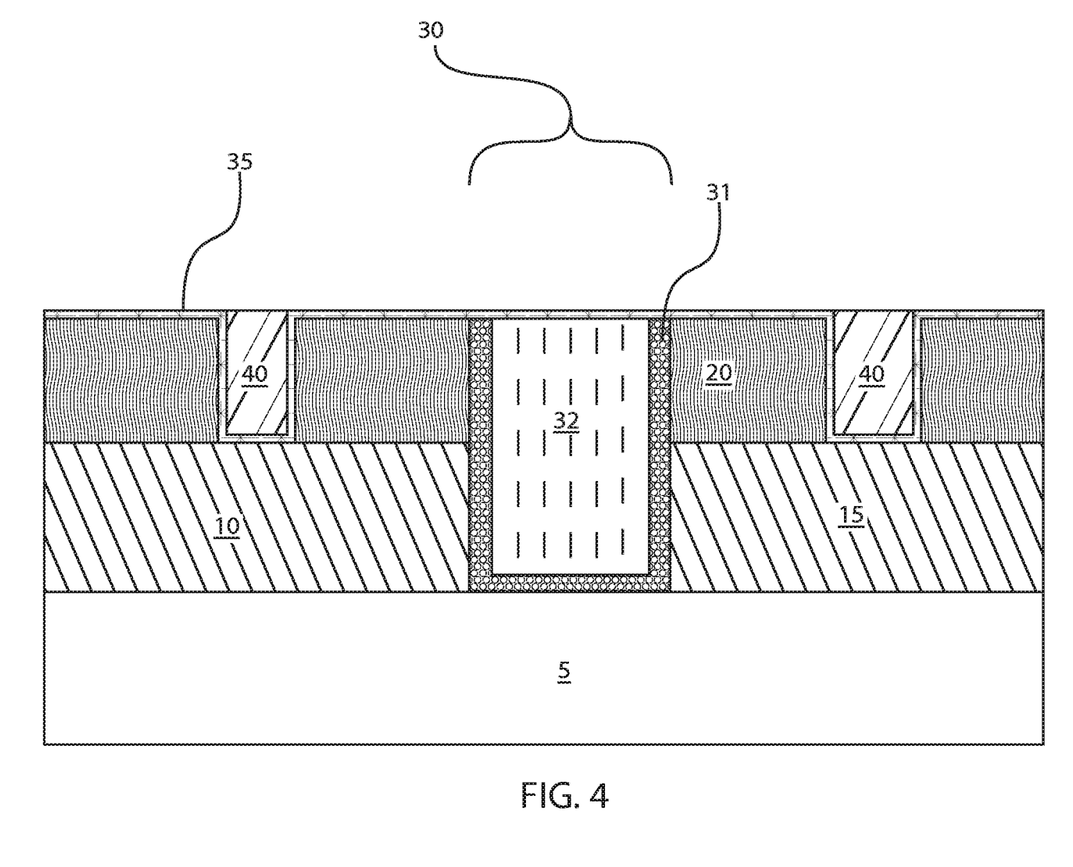
FIG. 4 is a side cross-sectional view of planarizing the structure depicted in FIG. 3.

FIG. 4 depicts one embodiment of planarizing the structure depicted in FIG. 3. The planarizing process removes the portion of the metal fill 40 that extends from the contact openings 25, as well as the portion of the n-type zinc oxide layer 35 that extends from the contact openings 25. In one example, the planarization process includes chemical mechanical planarization (CMP).

In some embodiments, the method described with reference to FIGS. 1-4, provides a metal oxide semiconductor field effect transistor (MOSFET) that includes source and drain regions 10, 15 that are doped to an n-type conductivity, and are composed of a type III-V semiconductor material. The source region 10 and the drain region 15 may be composed of indium gallium arsenide (InGaAs). A contact is present to at least one of the source and drain regions 10, 15, wherein the contact comprises an interface passivation layer atop the at least one source and drain region 10, 15, and an n-type zinc oxide layer 35. The interface passivation layer may be a sulfur passivation layer which may be composed of sulfur and indium, and having a monolayer thickness. The interface passivation layer may be an aluminum containing dielectric, such as aluminum oxide ($Al_2O_3$), that can be formed using atomic layer deposition, and has a monolayer thickness. The interface passivation layer may include both of the aforementioned sulfur passivation layer and aluminum containing dielectric; only the sulfur passivation without the aluminum containing dielectric, or only the aluminum containing dielectric without the sulfur passivation layer. In some embodiments, the n-type zinc oxide layer 35 provides that a conduction band of the type III-V semiconductor material of the at least one source and drain region 10, 15, e.g., at least one source and/or drain region 10, 15 of n-type indium gallium arsenide (InGaAs), is substantially aligned with a conduction band of the n-type zinc oxide containing layer 35. The contact may further include a metal containing portion, i.e., metal fill 40, on the n-type zinc oxide containing layer 35. In some examples, the meal containing portion, i.e., metal fill 40, may be composed of titanium (Ti) and/or aluminum (Al).

The contact structure described herein may be employed in InGaAs-based MOSFET device for high performance microelectronics. The contact structure disclosed herein provides for a minimized contact resistance between the metal contact, i.e., metal fill 40, and the n-type InGaAs of the source and drain regions 10, 15. For example, the sheet resistance between the metal contact, i.e., metal fill 40, and the n-type InGaAs of the source and drain regions 10, 15 may range from 155 ohm/sq to 175 ohm/sq. In another example, the sheet resistance between the metal contact, i.e., metal fill 40, and the n-type InGaAs of the source and drain regions 10, 15 may range from 160 ohm/sq to 170 ohm/sq. For example, the contact resistance between the metal contact, i.e., metal fill 40, and the n-type InGaAs of the source and drain regions 10, 15 may range from $1 \times 10^{-8}$ ohm-cm$^2$ to $5 \times 10^{-8}$ ohm-cm$^2$. In another example, the contact resistance between the metal contact, i.e., metal fill 40, and the n-type InGaAs of the source and drain regions 10, 15 may be equal to $3 \times 10^{-8}$ ohm-cm$^2$.

Figure 5:
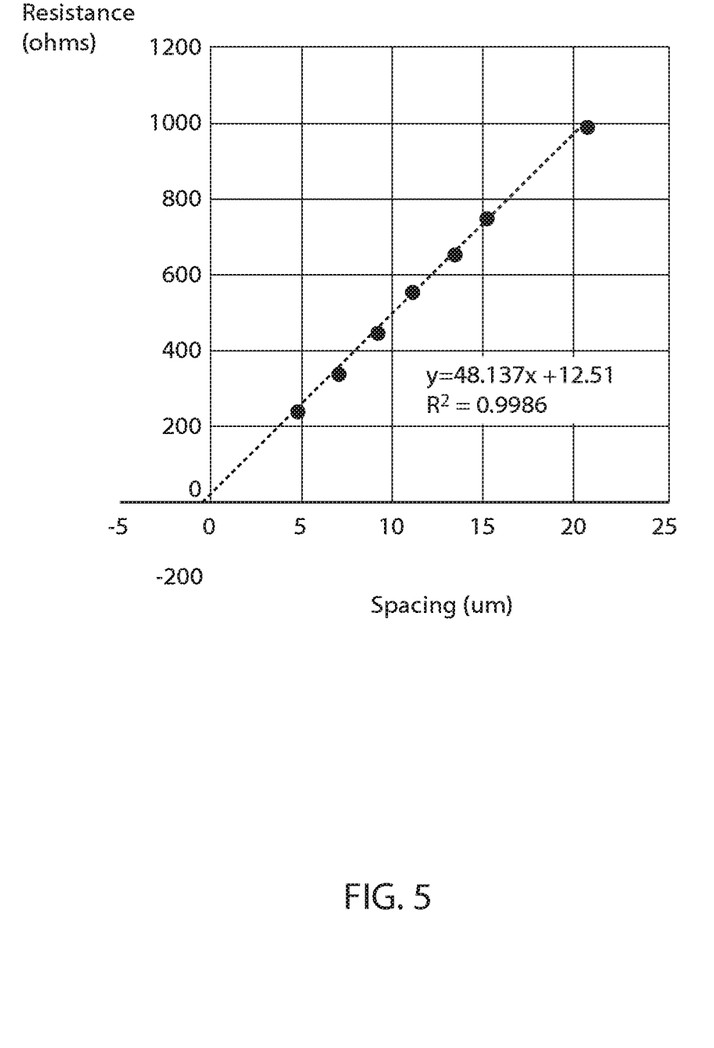
FIG. 5 is a plot of the contact resistivity of a contact to a source/drain region including a type III-V semiconductor material and an n-type conductivity, in which the contact includes a layer of n-type zinc oxide and a metal fill composed of titanium and aluminum (Ti—Al).

The contact resistance of the contacts that are formed with reference to FIGS. 1-4 is further characterized by the plot illustrated in FIG. 5. FIG. 5 is a plot of the contact resistivity of a contact to a source/drain region 10, 15 including a type III-V semiconductor material and an n-type conductivity, in which the contact includes a layer of n-type zinc oxide layer 35 and a metal fill 40 composed of titanium and aluminum (Ti—Al). The interface of the source and drain regions was passivated with a sulfur passivation layer followed by an aluminum oxide layer. The plot depicted in FIG. 5 illustrates a sheet resistance of 168 ohm/sq and a contact resistance equal to equal to $3 \times 10^{-8}$ ohm-cm$^2$.

In some embodiments, the n-type zinc oxide layer 35 provides a heavily doped n-type material with an electron density higher than InGaAs, to reduce metal-contact resistance. The sulfur passivation layer and the aluminum containing layer, e.g., aluminum oxide layer, deposited using atomic layer deposition provide an interface passivation layer that reduces Fermi-level pinning at InGaAs interface, i.e., interface surface of the source and drain regions 10, 15.

Figure 6:
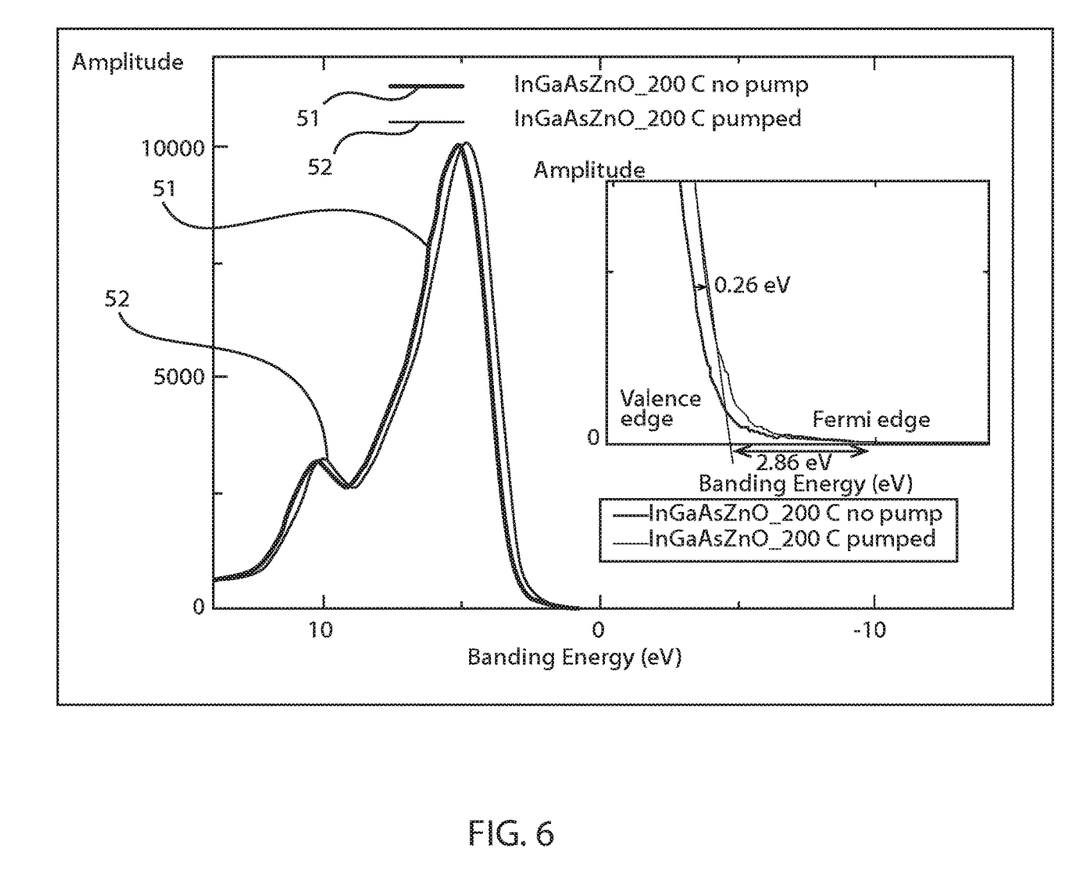
FIG. 6 is a plot of a band alignment between an n-type zinc oxide layer and a type III-V semiconductor material of indium gallium arsenide (InGaAs), in accordance with one embodiment of the present disclosure.

The aforementioned method sequence provides one embodiment of a method for forming a zinc oxide (ZnO)-indium gallium arsenide (InGaAs) contact. More specifically, the aforementioned method sequence can provide for band-alignment between n+-ZnO layer 35 and the n-type InGaAs of the source and drain region 10, 15. In some embodiment, the contact functions at its optimum electrical performance when the conduction band of the InGaAs material of the n-type source and drain regions 10, 15 aligned with the conduction band of n-ZnO layer 35. The band alignment is further characterized with reference to FIG. 6. FIG. 6 is a plot of a band alignment between an n-type zinc oxide layer and a type III-V semiconductor material of indium gallium arsenide (InGaAs), in accordance with one embodiment of the present disclosure. The plots depicted in FIG. 6 illustrate a negligible barrier in the conduction band InGaAs/ZnO:Al.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS.

Having described preferred embodiments of indium gallium arsenide metal oxide semiconductor field effect transistor having a low contact resistance to metal electrodes, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
    providing a field effect transistor including at least one of a source region and a drain region composed of a type III-V semiconductor material and an n-type conductivity;
    forming at least one of sulfur passivation layer and an aluminum containing layer on an interface surface of the at least one of said source region and said drain region of the type III-V semiconductor material to provide a passivated surface of said at least one of the source region and the drain region;
    forming an n-type zinc oxide containing layer on the passivated surface of said at least one of the source region and the drain region; and
    forming a metal contact on the n-type zinc oxide containing layer.

2. The method of claim 1, wherein the type III-V semiconductor material that provides the at least one of the source region and the drain region is indium gallium arsenide (InGaAs).

3. The method of claim 1, wherein a channel region of the field effect transistor comprises indium gallium arsenide (InGaAs).

4. The method of claim 1, wherein the sulfur passivation layer is formed by applying a thiourea containing solution to the at least one of the source region and the drain region.

5. The method of claim 4, wherein the sulfur passivation layer is a monolayer in thickness.

6. The method of claim 1, wherein the aluminum containing layer comprises aluminum oxide formed by atomic layer deposition (ALD).

7. The method of claim 5, wherein the aluminum containing layer is a monolayer in thickness.

8. The method of claim 1, wherein the n-type zinc oxide containing layer is formed by atomic layer deposition.

9. The method of claim 1, wherein the metal contact is composed of a composition selected from aluminum, titanium, and combinations thereof.

10. The method of claim 1, wherein a conduction band of the type III-V semiconductor material that provides the at least one of the source region and the drain region is substantially aligned with a conduction band of the n-type zinc oxide containing layer.

11. A method of forming a semiconductor device comprising:
providing a field effect transistor including at least one of a source region and a drain region composed of indium gallium arsenide (InGaAs) doped to an n-type conductivity;
forming at least one of sulfur passivation layer and an aluminum containing layer on an interface surface of the at least one source region and said drain region of the type III-V semiconductor material to provide a passivated surface of said at least one of the source region and the drain region;
forming an n-type zinc oxide containing layer on the passivated surface of the source region and the drain region, wherein a conduction band of the InGaAs in said at least one of the source and drain region is substantially aligned with a conduction band of the n-type zinc oxide containing layer; and
forming a metal contact is formed on the n-type zinc oxide containing layer.

12. The method of claim 11, wherein a channel region of the filed effect transistor comprises indium gallium arsenide (InGaAs).

13. The method of claim 11, wherein the sulfur passivation layer is formed by applying a thiourea containing solution to the at least one of the source region and the drain region.

14. The method of claim 11, wherein the aluminum containing layer comprises aluminum oxide formed by atomic layer deposition (ALD).

15. A semiconductor device comprising:
source and drain regions that are doped to an n-type conductivity and comprised of a type III-V semiconductor material; and
a contact to at least one of the source and drain regions, wherein the contact comprises an interface passivation layer atop the at least one source and drain region, and an n-type zinc oxide layer, wherein a conduction band of the type III-V semiconductor material of the at least one source and drain region is substantially aligned with a conduction band of the n-type zinc oxide containing layer.

16. The semiconductor device of claim 15, wherein the contact may further include a metal containing portion on the n-type zinc oxide containing layer.

17. The semiconductor device of claim 16, wherein the metal contact is composed of a composition selected from aluminum, titanium, and combinations thereof.

18. The semiconductor device of claim 15, wherein the type III-V semiconductor material of the source and drain regions is indium gallium arsenide (InGaAs).

19. The semiconductor device of claim 15, wherein the interface passivation layer includes a sulfur passivation layer.

20. The semiconductor device of claim 15, wherein the interface passivation layer includes an aluminum oxide monolayer.

* * * * *